(12) United States Patent
Matsumoto

(10) Patent No.: US 8,264,296 B2
(45) Date of Patent: Sep. 11, 2012

(54) VOLTAGE CONTROLLED OSCILLATOR

(75) Inventor: Takashi Matsumoto, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/929,775

(22) Filed: Feb. 15, 2011

(65) Prior Publication Data

US 2011/0199161 A1    Aug. 18, 2011

(30) Foreign Application Priority Data

Feb. 16, 2010 (JP) ............................... P.2010-031431

(51) Int. Cl.
*H03B 5/32* (2006.01)
(52) U.S. Cl. ..................... 331/177 V; 331/158; 331/167
(58) Field of Classification Search .................. 331/158, 331/167, 177 V
See application file for complete search history.

(56) References Cited

U.S. PATENT DOCUMENTS 7,227,421 B2 * 6/2007 Hashimoto ................... 331/158

FOREIGN PATENT DOCUMENTS

| JP | 07-015238 | 1/1995 |
| JP | 07-240628 | 9/1995 |
| JP | 2000-183650 | 6/2000 |
| JP | 2001-016039 | 1/2001 |
| JP | 2007-150461 | 6/2007 |
| JP | 2010-016512 | 1/2010 |

* cited by examiner

*Primary Examiner* — Robert Pascal
*Assistant Examiner* — James E Goodley
(74) *Attorney, Agent, or Firm* — Jacobson Holman PLLC

(57) ABSTRACT

A voltage controlled oscillator (VCO) securing a wide range of variable amount of oscillatory frequency is provided. In the VCO, a resistor R1 and a capacitor C1 are connected in series on a line of a crystal resonator and a control voltage supply terminal, a cathode of a variable-capacitance diode VD1 is connected between the R1 and the C1, and an anode of the VD1 is grounded. A parallel-connected circuit is disposed between the C1 and a port connected with the crystal resonator, the parallel-connected circuit including a variable-capacitance diode VD2 and a capacitor C3 connected in series, an expansion coil L1, and a Q dump resistor R6 which are connected in parallel. The parallel-connected circuit on an input side is grounded via a resistor R4, and a point between the R1 and the C1 and a point between the VD2 and the C3 are connected via a resistor R5.

20 Claims, 5 Drawing Sheets

APPLIED VOLTAGE TO THE VARIABLE-CAPACITANCE DIODE VD4

VOLTAGE CONTROLLED OSCILLATOR

This application has a priority of Japanese no. 2010-031431 filed Feb. 16, 2010, hereby incorporated by reference.

BACKGROUND OF THE INVENTION

1. Field of the Invention

The present invention relates to a voltage controlled oscillator (VCXO: Voltage Controlled Crystal Oscillator), and more particularly relates to a voltage controlled oscillator enabling a large variable amount of oscillatory frequency.

2. Description of the Related Art

[Prior Art]

In recent years, a large variable amount of frequency has been required for a voltage controlled oscillator.

In a conventional voltage controlled oscillator, a variable amount of oscillatory frequency is secured by applying a control voltage to a variable-capacitance diode connected in series with a crystal resonator and by further connecting an expansion coil in series between the crystal resonator and the variable-capacitance diode.

As another frequency adjusting method for oscillator, a conventional voltage controlled oscillator typically uses a method of replacing a fixed capacitor to change a load capacitance.

More specifically, capacitors connected in parallel are inserted between a crystal resonator and a variable-capacitance diode connected in series with the crystal resonator, and one of the capacitors connected in parallel is replaced so as to increase a load capacitance of a circuit, thus adjusting the frequency.

Note that a control voltage applied to the variable-capacitance diode is varied so as to change a capacitance of the variable-capacitance diode, whereby a frequency of the voltage controlled oscillator can be changed.

[Related Art]

Related art includes: Japanese Patent Application Laid-Open No. 2001-16039 "Variable frequency oscillation circuit" (Applicant: Kinseki Corporation/Patent Document 1), Japanese Patent Application Laid-Open No. H07-15238 "Voltage controlled oscillator" (Applicant: Mitsubishi Materials Corporation/Patent Document 2), and Japanese Patent Application Laid-Open No. 2000-183650 "Voltage oscillator" (Applicant: Toyo Communication Equip Co Ltd/Patent Document 3).

Patent Document 1 discloses a variable frequency oscillation circuit, and FIG. 1 illustrates a crystal vibrating reed and a variable-capacitance diode connected with an oscillation circuit are connected in series with a circuit including an inductance and a capacitor connected in parallel.

As compared with a conventional circuit of FIG. 5 in Patent Document 1, the capacitor and the inductance are arranged in parallel, so that a frequency variable amount can be increased.

Patent Document 2 discloses a voltage controlled oscillator in which both ends of a piezoelectric vibrating reed are connected via a circuit including a parallel circuit of a variable capacitor and a coil. As compared with a conventional circuit of FIG. 4 in Patent Document 2, the circuit of FIG. 1 in Patent Document 2 can increase a frequency variable amount.

Patent Document 3 discloses a voltage oscillator in which one end of a serially-connected circuit including a first resistor, a digital variable resistor IC and a second resistor is connected with a power source of a Colpitts crystal oscillator and the other end is grounded, and an output voltage of the digital variable resistor IC is connected with a cathode of a variable-capacitance diode.

In Patent Document 3, the digital variable resistor IC is regulated so that a capacitance of the diode is changed and a frequency is adjusted, thus making it easy to adjust the frequency as compared with the case of using a trimmer capacitor or the like.

SUMMARY OF THE INVENTION

The conventional voltage controlled oscillators, however, do not sufficiently meet the needs in recent years for a large variable amount of oscillatory frequency, in particular, having a problem of difficulty in securing a frequency variable amount in a voltage controlled oscillator requested to decrease a power supply voltage such as to +2.5V or +1.8V.

As for the conventional method of adjusting a frequency of a voltage controlled oscillator by replacing a fixed capacitor so as to change a load capacitance, such a method requires operations such as frequency measurement, solder application, chip soldering, frequency confirmation and soldering confirmation, thus leading to a problem of a significant increase in man-hours.

Further, some products have poor yield rates for the adjustment (a passing rate for the first inspection), thus requiring re-adjustment, which becomes a bottleneck in cost reduction.

In view of the above-stated circumstances, it is an object of the present invention to provide a voltage controlled oscillator capable of increasing a variable amount of oscillatory frequency.

In order to cope with the above-stated problems in the conventional techniques, a voltage controlled oscillator of the present invention that changes an oscillatory frequency in accordance with a control voltage, includes a crystal resonator and a control voltage supply terminal through which a control voltage is applied. A first resistor and a first capacitor are connected in series on a line of the crystal resonator and the control voltage supply terminal, a cathode of a first variable-capacitance diode is connected between the first resistor and the first capacitor, and an anode of the first variable-capacitance diode is grounded, a first parallel-connected circuit is disposed between the first capacitor and the crystal resonator, the first parallel-connected circuit including a second variable-capacitance diode and a second capacitor connected in series, and a first coil, which are connected in parallel, a point between the first capacitor and the first parallel-connected circuit on an input side is grounded via a second resistor, and a point between the first resistor and the first capacitor and a point between a cathode of the second variable-capacitance diode and the second capacitor are connected via a third resistor.

Note that the above-stated configuration is based on FIG. 3.

Thus, as the control voltage is changed, the capacitance of the first variable-capacitance diode accordingly changes. At this time, the capacitance of the second variable-capacitance diode also changes, so that the inductance of the first parallel-connected circuit also changes. Thus, with the change in capacitance of the first variable-capacitance diode and the change in inductance of the first parallel-connected circuit, a wide range of change amount of oscillatory frequency can be secured.

In the voltage controlled oscillator of the present invention, the crystal resonator may be connected on an output side of the first parallel-connected circuit.

In the voltage controlled oscillator of the present invention, the crystal resonator may be connected with a point between the cathode of the second variable-capacitance diode and the second capacitor of the parallel-connected circuit.

Note that the above-stated configuration is based on FIG. 5.

In the voltage controlled oscillator of the present invention, a Q dump resistor may be connected in parallel with the first parallel-connected circuit.

In the voltage controlled oscillator of the present invention, a third variable-capacitance diode may be disposed between the first resistor and the first capacitor, and a point between the first capacitor and an anode of the third variable-capacitance diode may be grounded via a fourth resistor.

Note that the above-stated configuration is based on FIG. 6.

In the voltage controlled oscillator of the present invention, a second parallel-connected circuit may be disposed between the first capacitor and the first parallel-connected circuit, the second parallel-connected circuit including a fourth variable-capacitance diode and a third capacitor connected in series, and a second coil, which are connected in parallel, a point between the first capacitor and the second parallel-connected circuit on an input side may be grounded via a fifth resistor, a digital potentiometer may be disposed to apply a fixed voltage to a point between a cathode of the fourth variable-capacitance diode and the third capacitor, the digital potentiometer being equipped with a function of a Q dump resistor.

Note that the above-stated configuration is based on FIG. 10.

A voltage controlled oscillator of the present invention that changes an oscillatory frequency in accordance with a control voltage includes a crystal resonator and a control voltage supply terminal through which a control voltage is applied. A first resistor and a first capacitor are connected in series on a line of the crystal resonator and the control voltage supply terminal, a cathode of a first variable-capacitance diode is connected between the first resistor and the first capacitor, and an anode of the first variable-capacitance diode is grounded, a parallel-connected circuit is disposed between the first capacitor and the crystal resonator, the parallel-connected circuit including a second variable-capacitance diode and a second capacitor connected in series, and a coil, which are connected in parallel, a point between the first capacitor and the parallel-connected circuit on an input side is grounded via a second resistor, and a digital potentiometer is disposed to apply a fixed voltage to a point between a cathode of the second variable-capacitance diode and the second capacitor, the digital potentiometer being equipped with a function of a Q dump resistor.

Note that the above-stated configuration is based on FIG. 8.

Thus, the digital potentiometer is used to adjust a voltage applied to the second variable-capacitance diode, so as to change the inductance of the parallel-connected circuit, thus adjusting the frequency of the voltage controlled oscillator. Therefore, this voltage controlled oscillator has the advantage of simplifying the frequency adjustment of the voltage controlled oscillator.

A voltage controlled oscillator of the present invention that changes an oscillatory frequency in accordance with a control voltage, includes a crystal resonator and a control voltage supply terminal through which a control voltage is applied. A first capacitor and a second capacitor connected in parallel, and a first resistor are connected in series on a line of the crystal resonator and the control voltage supply terminal, a first variable-capacitance diode is disposed between the first resistor and the first and the second capacitors, a point between the first and the second capacitors and an anode of the first variable-capacitance diode is grounded via a second resistor, a parallel-connected circuit on an input side is connected between the first resistor and a cathode of the first variable-capacitance diode, the parallel-connected circuit including a third capacitor and a coil connected in series, a second variable-capacitance diode and a Q dump resistor, which are connected in parallel, and the parallel-connected circuit on an output side is grounded.

Note that the above-stated configuration is based on FIG. 7.

Thus, as the control voltage is changed, the capacitance of the first variable-capacitance diode accordingly changes. At this time, the capacitance of the second variable-capacitance diode also changes, so that the inductance of the parallel-connected circuit also changes. Thus, with the change in capacitance of the first variable-capacitance diode and the change in inductance of the parallel-connected circuit, a wide range of change amount of oscillatory frequency can be secured.

DESCRIPTION OF REFERENCE NUMBERS

10: digital potentiometer, 11: oscillation circuit, 12: supply power source, 13: control voltage supply terminal, C: capacitor, L: expansion coil, R: resistor, VD: variable-capacitance diode, X: crystal oscillator <Description of Preferred Embodiment>

The following describes embodiments of the present invention, with reference to the drawings.

[Summary of Embodiments]

In a voltage controlled oscillator according to one embodiment of the present invention, as a control voltage is changed, the capacitance of a first variable-capacitance diode accordingly changes. At this time, the capacitance of a second variable-capacitance diode also changes, so that the inductance of a parallel-connected circuit also changes. Thus, with the change in capacitance of the first variable-capacitance diode and the change in inductance of the parallel-connected circuit, a wide range of change amount of oscillatory frequency can be secured.

Figure 1:
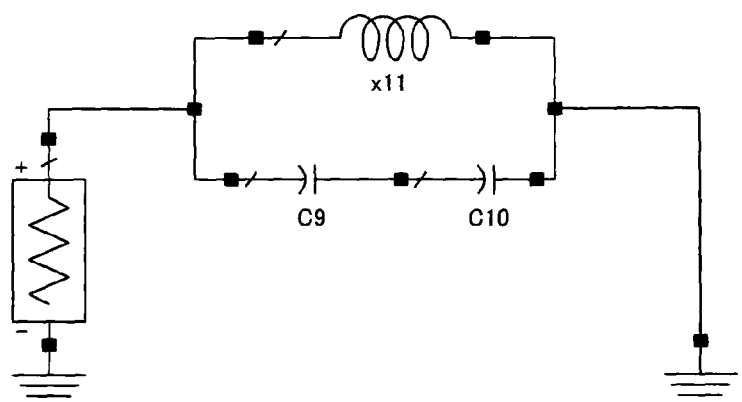
FIG. 1 is a circuit diagram describing the basic principle.

[Basic principle of the Present Invention: FIG. 1]

Referring to FIG. 1, the basic principle according to embodiments of the present invention is described below. FIG. 1 is a circuit diagram describing the basic principle.

As the basic principle, an expansion coil and a variable-capacitance diode are connected in parallel so as to control the inductance, thus securing a large variable amount of frequency.

For instance, as illustrated in FIG. 1, an inductor X11 is connected in parallel with capacitors C9 and C10, and a capacitance thereof is changed, thus changing the inductance.

Figure 2:
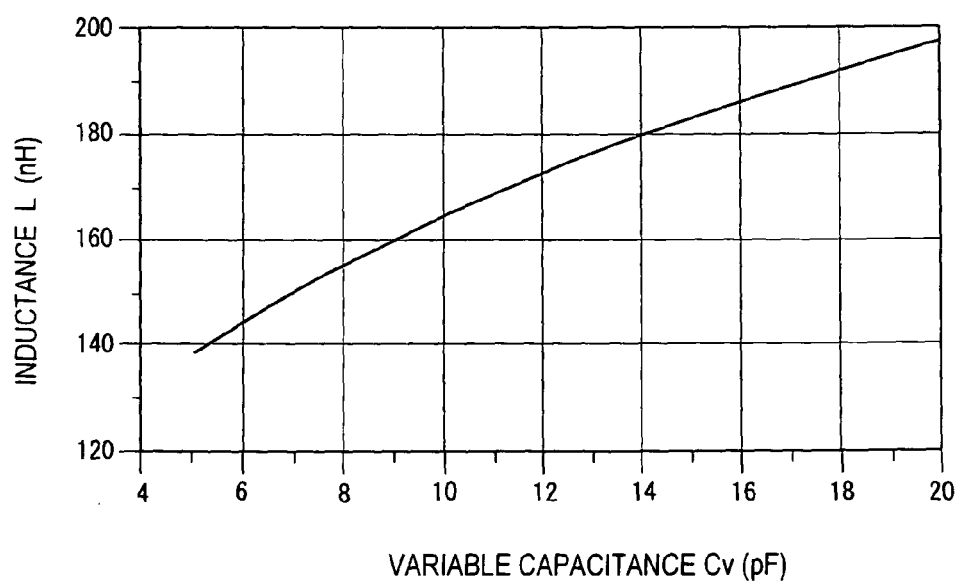
FIG. 2 illustrates a relationship between the capacitance and the inductance based on the basic principle.

[Relationship Between Capacitance and Inductance Based on the Basic Principle: FIG. 2]

Referring to FIG. 2, a relationship between the capacitance and the inductance in the above-stated circuit of FIG. 1 is described. FIG. 2 illustrates a relationship between the capacitance and the inductance based on the basic principle.

As illustrated in FIG. 2, the relationship between the capacitance and the inductance in the circuit of FIG. 1 is such that the inductance (L) increases with increases in the variable capacitance (Cv).

The variable capacitance (Cv) refers to the capacitance C10 in FIG. 1, and the inductance (L) refers to an inductance of a circuit including the inductor X11 and the capacitors C9 and C10 of FIG. 1.

Figure 3:
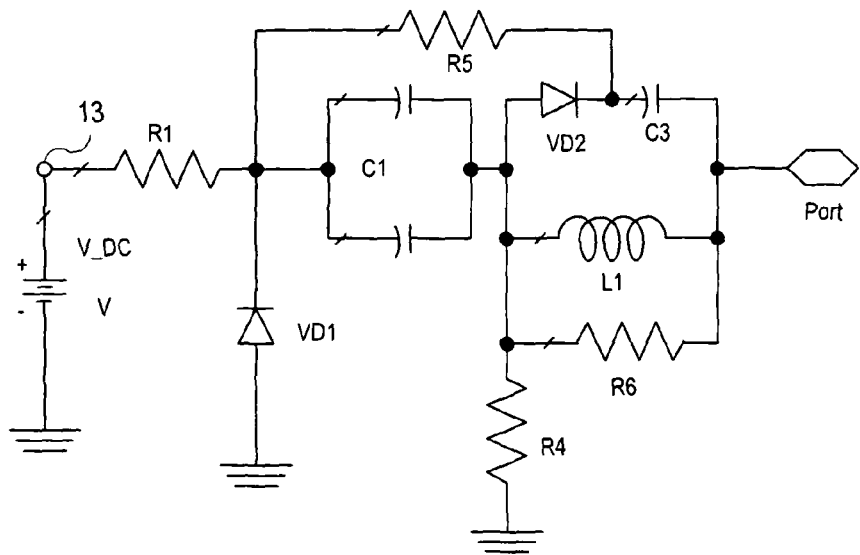
FIG. 3 is a circuit diagram of a first voltage controlled oscillator.

[First Voltage Controlled Oscillator: FIG. 3]

Referring next to FIG. 3, a first voltage controlled oscillator according to one embodiment of the present invention is described below. FIG. 3 is a circuit diagram of the first voltage controlled oscillator. The first voltage controlled oscillator is configured to incorporate the basic principle of FIG. 1 and implement the characteristic of FIG. 2.

As illustrated in FIG. 3, the first voltage controlled oscillator (first oscillator) is configured so that a control voltage supply terminal 13 to which a power source V of a control voltage V_DC is applied is connected with a capacitor C1 via a resistor R1, and the capacitor C1 is connected with one end of a parallel-connected circuit (a first parallel-connected circuit) including a variable-capacitance diode VD2 and a capacitor C3, an expansion coil L1 and a Q dump resistor R6, and the other end of the parallel-connected circuit is connected with a port.

That is, the resistor R1, the capacitor C1 and the parallel-connected circuit are disposed on a line supplying a control voltage to the port.

The port is connected to an oscillatory circuit provided with a crystal resonator.

The variable-capacitance diode VD2 is connected with the capacitor C1 on the anode side and is connected with the capacitor C3 on the cathode side.

The Q dump resistor R6 is provided so as to avoid LC oscillation of the parallel-connected circuit.

One end of the parallel-connected circuit is grounded via a resistor R4.

The cathode of a variable-capacitance diode VD1 is connected between the resistor R1 and the capacitor C1, and the variable-capacitance diode VD1 is grounded on the anode side.

A point between the resistor R1 and the capacitor C1 is connected with a point between the variable-capacitance diode VD2 and the capacitor C3 via a resistor R5.

The capacitor C1 is configured so as to additionally include a capacitor for frequency adjustment connected in parallel.

That is, the capacitor C1 includes parallel-connected capacitors, one of which is replaced to change the load capacitance of the circuit for frequency adjustment.

In the first oscillator, a control voltage is changed so as to change the capacitance of the variable-capacitance diode VD1, while applying the control voltage between the variable-capacitance diode VD2 and the capacitor C3 via the resistor R5 so that the voltage from the resistor R5 causes a change in the capacitance of the variable-capacitance diode VD2 to change the inductance of the parallel-connected circuit, thus securing a large change amount of oscillatory frequency.

Figure 4:
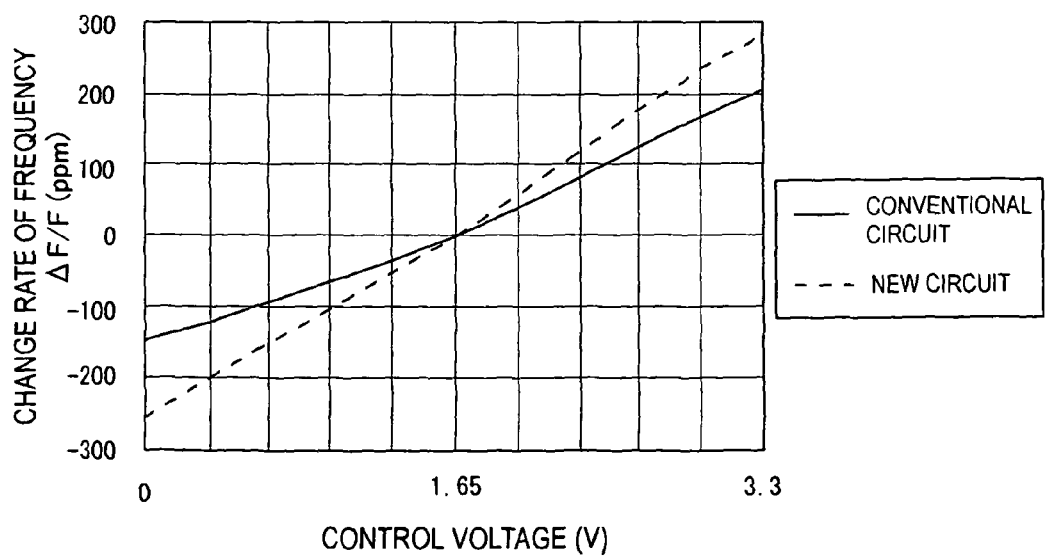
FIG. 4 illustrates the change rate of frequency with control voltage in a first oscillator.

[Change Rate of Frequency: FIG. 4]

Referring to FIG. 4, the change rate of frequency with control voltage in the first oscillator is described below. FIG. 4 illustrates the change rate of frequency with control voltage in the first oscillator.

In FIG. 4, the horizontal axis shows a control voltage from 0 to 3.3 V, and the vertical axis shows the change rate of frequency ($\Delta F/F$). Herein, F denotes the frequency when the control voltage is 1.65 V, and $\Delta F$ denotes the change amount of frequency from F. As illustrated in FIG. 4, the characteristic (dashed line) of the first oscillator (new circuit) has a gradient steeper than that of the characteristic (solid line) of a conventional circuit.

That is, the first oscillator enables a larger variable amount of oscillatory frequency as compared with the conventional one.

Herein, the conventional circuit refers to the circuit not provided with the resistors R4, R5 and R6, the variable-capacitance diode VD2, the capacitor C3, and the expansion coil L1 in the oscillation circuit of FIG. 3.

[Change Rate of Frequency with Low Control Voltage]

The following describes the change rate of frequency with low control voltages in the first oscillator.

As illustrated in FIG. 4, the change rate of frequency shows a large variable amount of frequency even with low control voltages from 0.0 to 2.5 V.

According to the simulation, the frequency variable amount of ±400 ppm can be obtained in the range of control voltages from +1.25±1.25 V.

Figure 5:
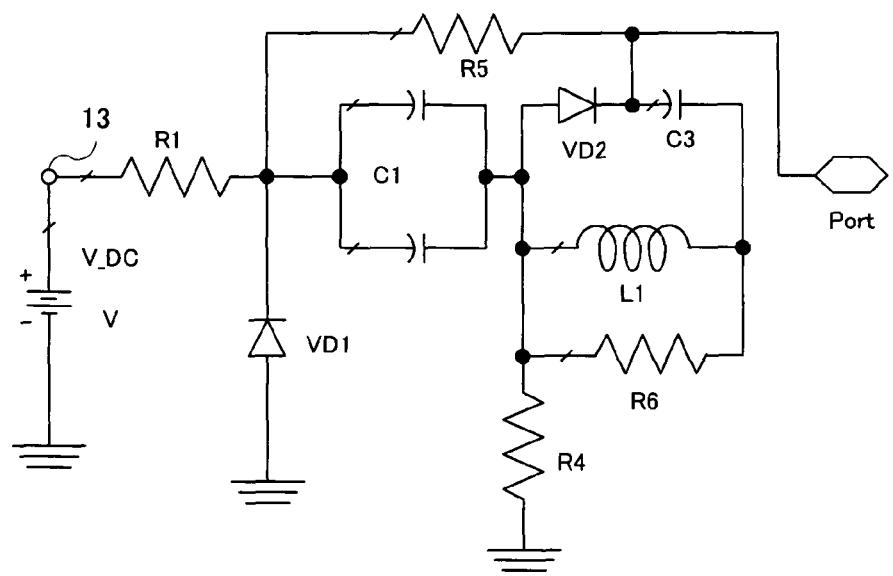
FIG. 5 is a circuit diagram of a second voltage controlled oscillator.

[Second Voltage Controlled Oscillator: FIG. 5]

Referring next to FIG. 5, a second voltage controlled oscillator according to one embodiment of the present invention is described below. FIG. 5 is a circuit diagram of the second voltage controlled oscillator.

The second voltage controlled oscillator (second oscillator) is substantially the same as the first oscillator illustrated in FIG. 3, but is different from the first oscillator in that a port is connected not with the output side of the parallel-connected circuit of the variable-capacitance diode VD2 and the capacitor C3, the expansion coil L1 and the Q dump resistor R6 but with a point between the cathode side of the variable-capacitance diode VD2 and the capacitor C3.

The second oscillator also can increase the variable amount of oscillatory frequency similarly to the first oscillator.

Figure 6:
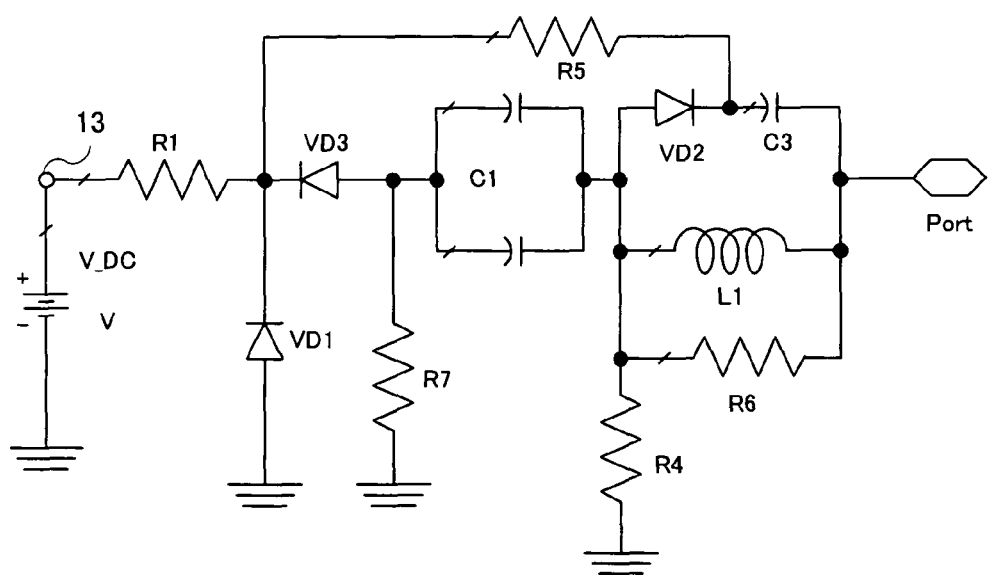
FIG. 6 is a circuit diagram of a third voltage controlled oscillator.

[Third Voltage Controlled Oscillator: FIG. 6]

Referring next to FIG. 6, a third voltage controlled oscillator according to one embodiment of the present invention is described below. FIG. 6 is a circuit diagram of the third voltage controlled oscillator.

The third voltage controlled oscillator (third oscillator) is substantially the same as the first oscillator illustrated in FIG. 3, but is different from the first oscillator in that a variable-capacitance diode VD3 is inserted in series between a capacitor C1 and a resistor R1, and a point between the variable-capacitance diode VD3 and the capacitor C1 is grounded via a resistor R7.

The cathode side of the variable-capacitance diode VD3 is connected with the resistor R1, and the anode side is connected with the capacitor C1.

The third oscillator also can secure a large variable amount of oscillatory frequency similarly to the first oscillator.

In the second oscillator of FIG. 5, the variable-capacitance diode VD3 and the resistor R7 may be provided as well, thus securing a large variable amount of frequency.

Figure 7:
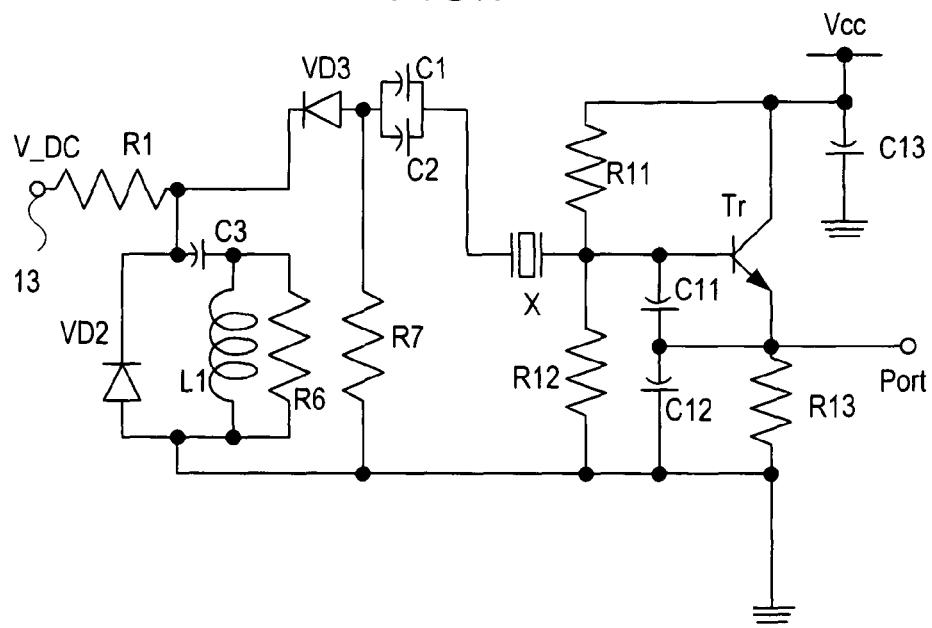
FIG. 7 is a circuit diagram of a fourth voltage controlled oscillator.

[Fourth Voltage Controlled Oscillator: FIG. 7]

Referring next to FIG. 7, a fourth voltage controlled oscillator according to one embodiment of the present invention is described below. FIG. 7 is a circuit diagram of the fourth voltage controlled oscillator.

In the fourth voltage controlled oscillator (fourth oscillator), a control voltage supply terminal 13 to which a control voltage V_DC is applied is connected with the cathode side of a variable-capacitance diode VD3 via a resistor R1, the anode side of the variable-capacitance diode VD3 is connected with one end of a crystal resonator X via a parallel circuit of capacitors C1 and C2, and the other end of the crystal resonator X is connected with the base of a transistor Tr.

A power supply voltage Vcc is applied to the collector of the transistor Tr, and the power supply voltage is grounded via a capacitor C13.

The power supply voltage Vcc is connected with the base of the transistor Tr via a resistor R11, the base is connected with one end of a resistor R12, and the other end of the resistor R12 is grounded. The base is further connected in series with capacitors C11 and C12, and the other end is grounded.

The emitter of the transistor Tr is grounded via a resistor R13.

A point between the capacitor C11 and the capacitor C12 is connected with the emitter of the transistor Tr, and is further connected with an output port of an oscillatory frequency.

A point between the resistor R1 and the variable-capacitance diode VD3 is connected with one end of a parallel-connected circuit of a capacitor C3 and an expansion coil L1, a variable-capacitance diode VD2, and a Q dump resistor R6, and the other end of the parallel-connected circuit is grounded.

In this parallel-connected circuit, one end of the capacitor C3 is connected with the resistor R1 side, the other end of the capacitor C3 is connected with the expansion coil L1 and is grounded, the cathode side of the variable-capacitance diode VD2 is connected with the resistor R1 side, and the anode side thereof is grounded.

A point between the anode side of the variable-capacitance diode VD3 and the parallel circuit of the capacitors C1 and C2 is grounded via a resistor R7.

[Operation of Fourth Oscillator]

In the fourth oscillator, as the control voltage V_DC is changed, the capacitance of the variable-capacitance diode VD3 accordingly changes. At this time, the capacitance of the variable-capacitance diode VD2 also changes, so that the inductance of the parallel-connected circuit also changes. Thus, with the change in capacitance of the variable-capacitance diode VD3 and the change in inductance of the parallel-connected circuit, a wide range of change amount of oscillatory frequency can be secured.

Figure 8:
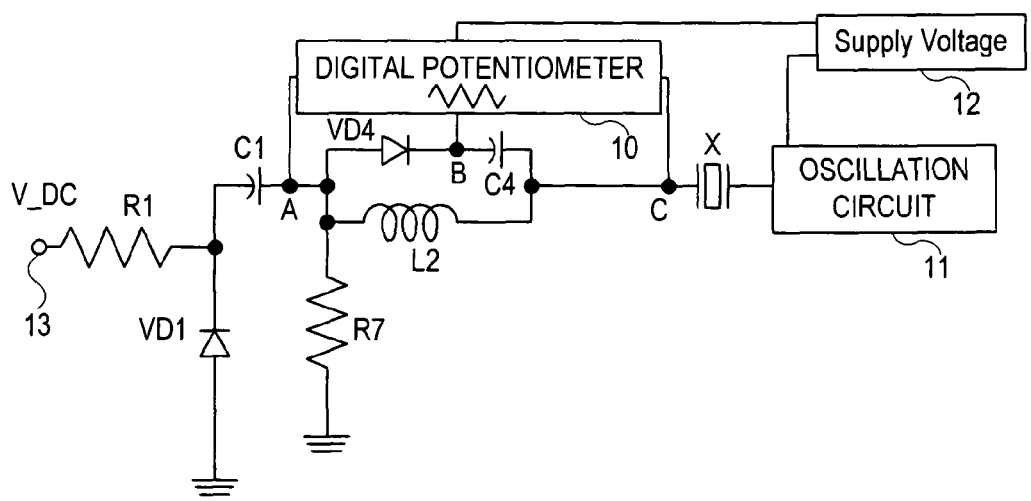
FIG. 8 is a circuit diagram of a fifth voltage controlled oscillator.

[Fifth Voltage Controlled Oscillator: FIG. 8]

Referring next to FIG. 8, a fifth voltage controlled oscillator according to one embodiment of the present invention is described below. FIG. 8 is a circuit diagram of the fifth voltage controlled oscillator.

In the fifth voltage controlled oscillator (fifth oscillator), a control voltage supply terminal 13 to which a control voltage V_DC is applied is connected with one end of a capacitor C1 via a resistor R1, the other end of the capacitor C1 is connected with one end of a crystal resonator X via a parallel-connected circuit of a variable-capacitance diode VD4 and a capacitor C4, and an expansion coil L2, and the other end of the crystal resonator X is connected with an oscillation circuit 11.

That is, the resistor R1, the capacitor C1 and the parallel-connected circuit are disposed on a line supplying a control voltage to the crystal resonator X.

A point between the resistor R1 and the capacitor C1 is connected with the cathode side of a variable-capacitance diode VD1, and the anode side of the variable-capacitance diode VD1 is grounded.

A point between the capacitor C1 and the parallel-connected circuit is grounded via a resistor R7.

A digital potentiometer 10 is further connected with a point between the capacitor C1 and the parallel-connected circuit, a point between the variable-capacitance diode VD4 and the capacitor C4 and a point between the parallel-connected circuit and the crystal resonator X.

A voltage of the supply voltage 12 is supplied to the digital potentiometer 10 and the oscillation circuit 11.

[Frequency Adjusting Method]

The following describes a method of adjusting the frequency in the fifth oscillator.

In general, a voltage controlled oscillator is required to adjust a frequency during a manufacturing process. At the time of this frequency adjustment for the fifth oscillator, the digital potentiometer 10 is used.

The digital potentiometer 10 includes a resistor therein and is configured to change a resistance value between terminals A and B and a resistance value between terminals B and C by an external signal.

Then, a voltage from the supply voltage is divided with the resistance value between terminals A and B and the resistance value between terminals B and C. The divided voltage between the terminals A and B is applied to the variable-capacitance diode VD4 and the voltage between the terminals B and C is applied to the capacitor C4.

Thusly, an external signal input to the digital potentiometer 10 is changed, whereby a voltage applied to the variable-capacitance diode VD4 is changed and the capacitance thereof is changed. Herein, as the capacitance of the variable-capacitance diode VD4 is changed, the inductance of the parallel-connected circuit is changed, so that an oscillatory frequency is changed.

Therefore, a change in the external signal enables adjustment of the oscillatory frequency. After finishing the adjustment of oscillatory frequency, there is no need to input a signal to the digital potentiometer 10.

As a specific process, an available method is to change a signal input to the digital potentiometer 10 while monitoring an oscillatory frequency, thus adjusting an oscillatory frequency. With this process, as compared with a conventional process of adjusting an oscillatory frequency by replacing a capacitor connected in series with a crystal resonator by soldering, the oscillatory frequency adjustment process is significantly simplified, so that the productivity of the voltage controlled oscillator is improved.

As another process of adjusting a frequency, an available method is to use a system that adjusts a signal input to the digital potentiometer 10 in accordance with an oscillatory frequency. With this process, an oscillatory frequency can be automatically adjusted. Thus, the oscillatory frequency adjustment process is further simplified, so that the productivity of the voltage controlled oscillator is improved.

A resistance component of the digital potentiometer 10 may be used as a Q dump resistor, whereby LC oscillation can be avoided.

Figure 9:
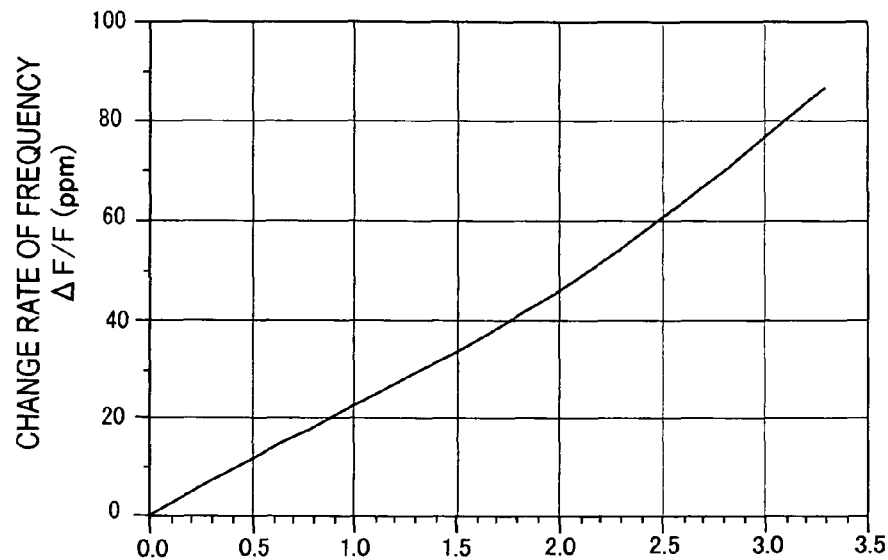
FIG. 9 illustrates the change rate of frequency with voltage applied to a variable-capacitance diode VD4 in the fifth oscillator.

[Change Rate of Frequency with Voltage Applied to Variable-Capacitance Diode VD4: FIG. 9]

Referring to FIG. 9, the change rate of frequency with voltage applied to the variable-capacitance diode VD4 in the fifth oscillator is described below. FIG. 9 illustrates the change rate of frequency with voltage applied to the variable-capacitance diode VD4 in the fifth oscillator.

As illustrated in FIG. 9, the horizontal axis shows a voltage applied to the variable-capacitance diode VD4 from 0 to 3.3 V, and the vertical axis shows the change rate of frequency. The frequency of 90 ppm can be changed with the voltage from 0 to 3.3 V.

Herein, the frequency of an oscillator often shows the distribution in the range of 90 ppm due to fluctuations of the characteristics of the transistors and the resistors constituting the oscillation circuit. Thus, the present embodiment can adjust the frequency sufficiently. Further, the selection of the capacitors and the variable-capacitance diodes allows the frequency adjustment range to be controlled.

Figure 10:
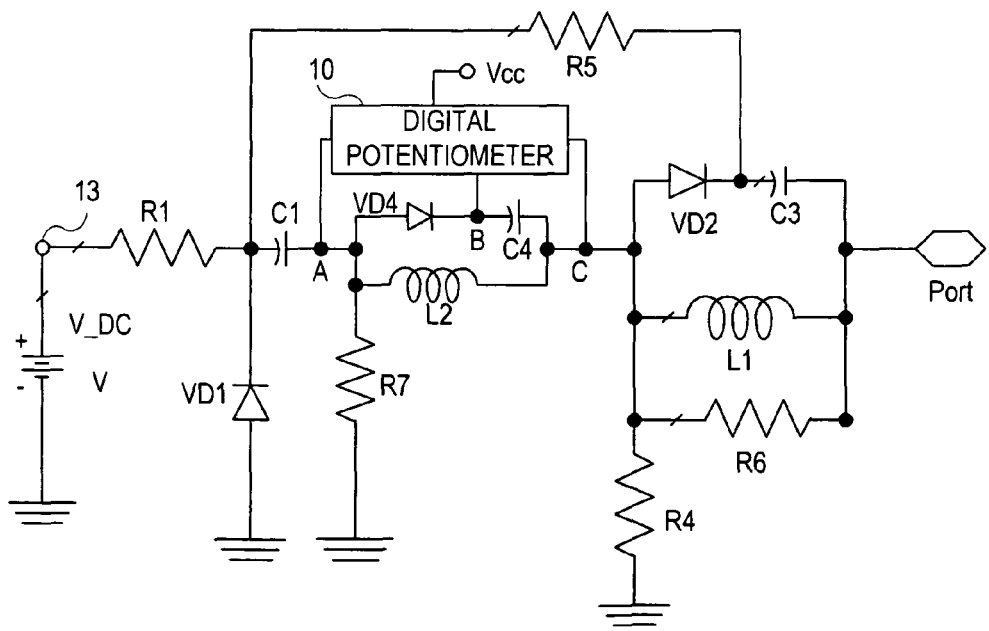
FIG. 10 is a circuit diagram of a sixth voltage controlled oscillator.

[Sixth Voltage Controlled Oscillator: FIG. 10]

Referring next to FIG. 10, a sixth voltage controlled oscillator according to one embodiment of the present invention is described below. FIG. 10 is a circuit diagram of the sixth voltage controlled oscillator.

As illustrated in FIG. 10, the sixth voltage controlled oscillator (sixth oscillator) is configured so that the capacitor C1 and the parallel-connected circuit (parallel-connected circuit including the variable-capacitance diode VD4 and the capacitor C4, and the expansion coil L2: second parallel-connected circuit) of FIG. 8 is disposed at a portion of the capacitor Cl in the first oscillator of FIG. 3, and a digital potentiometer 10 is further connected with both ends of the second parallel-connected circuit on the input side and the out put side so as to apply a voltage between the variable-capacitance diode VD4 and the capacitor C4, and a point between the capacitor C1 and the second parallel-connected circuit is grounded via a resistor R7.

The sixth oscillator includes the second parallel-connected circuit, the digital potentiometer 10 and the like based on the first oscillator of FIG. 3. Instead, based on the second oscillator of FIG. 5, the second parallel-connected circuit, the digital potentiometer 10 and the like may be provided.

According to the sixth oscillator, as the control voltage V_DC is changed, the capacitance of the variable-capacitance diode VD1 accordingly is changed. At this time, the capacitance of the variable-capacitance diode VD2 also changes, so that the inductance of the parallel-connected circuit also changes. Thus, with the change in capacitance of the variable-capacitance diode VD1 and the change in inductance of the parallel-connected circuit, a wide range of change amount of oscillatory frequency can be secured.

Further according to the sixth oscillator, the digital potentiometer 10 is used to adjust a voltage applied to the second variable-capacitance diode VD2, so as to change the inductance of the parallel-connected circuit, thus adjusting the frequency of the voltage controlled oscillator. Therefore, the sixth oscillator has the advantage of simplifying the frequency adjustment of the voltage controlled oscillator.

Since the sixth oscillator includes the configuration of the fifth oscillator, the sixth oscillator has the advantage described for the fifth oscillator as well.

According to the first to the fourth and the sixth oscillators, the control voltage can be reduced, and a wide variable range of frequency can be achieved. Further, these oscillators can be within a package size of 11.4×9.6 mm so as to meet the needs of clients.

The fifth and the sixth oscillators have the advantage of simplifying the process of adjusting the frequency and so improving the productivity of the voltage controlled oscillators.

[Advantages of Embodiments]

According to the first to the sixth oscillators, a capacitor is connected in parallel with an inductor, and the capacitance of the capacitor is changed so as to change the inductance, thus leading to the advantage of securing a wide range of variable amount of oscillatory frequency.

The present invention is suitable for a voltage controlled oscillator capable of securing a wide range of variable amount of oscillatory frequency.

What is claimed is:

1. A voltage controlled oscillator that changes an oscillatory frequency in accordance with a control voltage, comprising a crystal resonator and a control voltage supply terminal through which a control voltage is applied, wherein
    a first resistor and a first capacitor are connected in series on a line of the crystal resonator and the control voltage supply terminal,
    a cathode of a first variable-capacitance diode is connected between the first resistor and the first capacitor, and an anode of the first variable-capacitance diode is grounded,
    a first parallel-connected circuit is disposed between the first capacitor and the crystal resonator, the first parallel-connected circuit including a second variable-capacitance diode and a second capacitor connected in series, and a first coil, which are connected in parallel,
    a point between the first capacitor and the first parallel-connected circuit on an input side is grounded via a second resistor, and
    a point between the first resistor and the first capacitor and a point between a cathode of the second variable-capacitance diode and the second capacitor are connected via a third resistor.

2. The voltage controlled oscillator according to claim 1, wherein the crystal resonator is connected on an output side of the first parallel-connected circuit.

3. The voltage controlled oscillator according to claim 1, wherein the crystal resonator is connected with a point between the cathode of the second variable-capacitance diode and the second capacitor of the first parallel-connected circuit.

4. The voltage controlled oscillator according to claim 1, wherein a Q dump resistor is connected in parallel with the first parallel-connected circuit.

5. The voltage controlled oscillator according to claim 2, wherein a Q dump resistor is connected in parallel with the first parallel-connected circuit.

6. The voltage controlled oscillator according to claim 3, wherein a Q dump resistor is connected in parallel with the first parallel-connected circuit.

7. The voltage controlled oscillator according to claim 1, wherein
    a third variable-capacitance diode is disposed between the first resistor and the first capacitor, and
    a point between the first capacitor and an anode of the third variable-capacitance diode is grounded via a fourth resistor.

8. The voltage controlled oscillator according to claim 2, wherein
    a third variable-capacitance diode is disposed between the first resistor and the first capacitor, and
    a point between the first capacitor and an anode of the third variable-capacitance diode is grounded via a fourth resistor.

9. The voltage controlled oscillator according to claim 3, wherein
a third variable-capacitance diode is disposed between the first resistor and the first capacitor, and
a point between the first capacitor and an anode of the third variable-capacitance diode is grounded via a fourth resistor.

10. The voltage controlled oscillator according to claim 4, wherein
a third variable-capacitance diode is disposed between the first resistor and the first capacitor, and
a point between the first capacitor and an anode of the third variable-capacitance diode is grounded via a fourth resistor.

11. The voltage controlled oscillator according to claim 5, wherein
a third variable-capacitance diode is disposed between the first resistor and the first capacitor, and
a point between the first capacitor and an anode of the third variable-capacitance diode is grounded via a fourth resistor.

12. The voltage controlled oscillator according to claim 6, wherein
a third variable-capacitance diode is disposed between the first resistor and the first capacitor, and
a point between the first capacitor and an anode of the third variable-capacitance diode is grounded via a fourth resistor.

13. The voltage controlled oscillator according to claim 1, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

14. The voltage controlled oscillator according to claim 2, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

15. The voltage controlled oscillator according to claim 3, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

16. The voltage controlled oscillator according to claim 4, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

17. The voltage controlled oscillator according to claim 5, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

18. The voltage controlled oscillator according to claim 6, wherein
a second parallel-connected circuit is disposed between the first capacitor and the first parallel-connected circuit, the second parallel-connected circuit including a fourth variable-capacitance diode and a third capacitor connected in series, and a second coil, which are connected in parallel,
a point between the first capacitor and the second parallel-connected circuit on an input side is grounded via a fifth resistor,
a digital potentiometer is disposed to apply a fixed voltage to a point between a cathode of the fourth variable-capacitance diode and the third capacitor, the digital potentiometer being equipped with a function of a Q dump resistor.

19. A voltage controlled oscillator that makes an oscillatory frequency variable in accordance with a control voltage, comprising a crystal resonator and a control voltage supply terminal through which a control voltage is applied, wherein
a first resistor and a first capacitor are connected in series on a line of the crystal resonator and the control voltage supply terminal, a cathode of a first variable-capacitance diode is connected between the first resistor and the first capacitor, and an anode of the first variable-capacitance diode is grounded, a parallel-connected circuit is disposed between the first capacitor and the crystal resonator, the parallel-connected circuit including a second variable-capacitance diode and a second capacitor connected in series, and a coil, which are connected in parallel, a point between the first capacitor and the parallel-connected circuit on an input side is grounded via a second resistor, and a digital potentiometer is disposed to apply a fixed voltage to a point between a cathode of the second variable-capacitance diode and the second capacitor, the digital potentiometer being equipped with a function of a Q dump resistor.

20. A voltage controlled oscillator that makes an oscillatory frequency variable in accordance with a control voltage, comprising a crystal resonator and a control voltage supply terminal through which a control voltage is applied, wherein a first capacitor and a second capacitor connected in parallel, and a first resistor are connected in series on a line of the crystal resonator and the control voltage supply terminal, a first variable-capacitance diode is disposed between the first resistor and the first and the second capacitors, a point between the first and the second capacitors and an anode of the first variable-capacitance diode is grounded via a second resistor, a parallel-connected circuit on an input side is connected between the first resistor and a cathode of the first variable-capacitance diode, the parallel-connected circuit including a third capacitor and a coil connected in series, a second variable-capacitance diode, and a Q dump resistor, which are connected in parallel, and the parallel-connected circuit on an output side is grounded.

* * * * *